(12) United States Patent
Altizer

(10) Patent No.: US 7,711,348 B2
(45) Date of Patent: May 4, 2010

(54) RF RADIO AND METHOD FOR MONITORING WARNING ALERT DATA

(75) Inventor: Daniel T. Altizer, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 620 days.

(21) Appl. No.: 11/657,261

(22) Filed: Jan. 24, 2007

(65) Prior Publication Data

US 2008/0176526 A1 Jul. 24, 2008

(51) Int. Cl.
*H04M 11/04* (2006.01)
*H04Q 7/20* (2006.01)
(52) U.S. Cl. .................. 455/404.1; 455/161.1
(58) Field of Classification Search ... 455/161.1–161.3, 455/166.1–168.1, 179.1–180.1, 184.1, 188.1, 455/404.1
See application file for complete search history.

(56) References Cited

U.S. PATENT DOCUMENTS 3,750,032 A * 7/1973 Andrews ............... 455/154.2
6,526,268 B1 2/2003 Marrah et al.
6,553,215 B1 * 4/2003 Chung ..................... 455/218
6,728,522 B1 4/2004 Marrah et al.

OTHER PUBLICATIONS

"National Weather Service Instruction 10-1712, NOAA Weather Radio All Hazards (NWR) Specific Area Message Encoding (SAME)," Department of Commerce and National Oceanic & Atmospheric Administration and National Weather Service, Feb. 17, 2006, 24 pages.

* cited by examiner

*Primary Examiner*—Lee Nguyen
(74) *Attorney, Agent, or Firm*—Jimmy L. Funke

(57) ABSTRACT

An RF radio and a method of monitoring warning alert data is provided. The RF radio includes a radio receiver for receiving broadcast radio wave signals, and a tuner adjustable for selecting radio wave signal channels within AM and FM radio bands and radio wave signal channels within a weather band. The weather band is adapted to provide warning alert data. The radio also includes a controller for controlling the tuner to select a radio wave signal channel within the AM or FM radio band. The controller controls the tuner to periodically switch to the weather band and determines presence of warning alert data. The controller further initiates receipt of the warning alert data when such warning alert data is determined to be present.

30 Claims, 3 Drawing Sheets

RF RADIO AND METHOD FOR MONITORING WARNING ALERT DATA

TECHNICAL FIELD

The present invention generally relates to radio frequency (RF) radios and, more particularly, relates to a radio and method of monitoring alternate frequencies of a radio band for the presence of warning alert data.

BACKGROUND OF THE INVENTION

Audio radios generally receive and process radio frequency (RF) signals typically in the amplitude modulated (AM) or frequency modulated (FM) radio bands. FM/AM audio radios are commonly employed in various environments including on board automotive vehicles. In addition to receiving FM and AM radio bands, some vehicle radios incorporate a receiver that is further capable of receiving weather (WX) band signals. The National Oceanic and Atmospheric Administration (NOAA) broadcasts the weather band radio service in the United States. The NOAA weather band broadcast transmissions generally include seven narrow band frequency modulated channels in the very high frequency (VHF) band at frequencies ranging from 162.40 kHz to 162.55 kHz, with a 25 kHz channel separation between adjacent channels.

The NOAA weather band signals include weather and emergency alert data pertaining to local geographic regions which serves as a broadcast warning alert system. The NOAA weather band broadcast includes specific area message encoding (SAME) transmitting a coded message using audio frequency shift keying (AFSK). The SAME message provides digital information indicative of the geographic region covered by the accompanying message and the warning alert data. The warning alert data includes warning alerts related to weather such as warnings or watches for tornadoes, tsunamis, hurricanes, winter storms, flood warnings, and other weather related events. Additionally, the weather alert data includes non-weather related events, such as child abduction emergency warnings, civil danger warnings, civil emergency messages, earthquake warnings, evacuation warnings, fire warnings, amongst other non-weather related warnings.

With the conventional AM/FM/WX band radio, a user may select one frequency at a time from one of the available radio bands. If a user would like to acquire the weather band signal and its warning alert data, the user is typically required to select the weather band by activating a switch which tunes the tuner to the weather band. Once the weather and warning alert data information is no longer desired, the user must select the AM or FM band to return to the original radio band station.

The radio data system (RDS) in Europe broadcasts the identical information on multiple frequencies such that the same radio content can be provided in a vehicle as the vehicle travels from one broadcast frequency region to a different broadcast frequency region. In doing so, the RDS employs an alternate frequency (AF) update to periodically look for better quality alternate frequency broadcast signals. The radio stations generally are linked by the RDS data, which identifies each station as being on the network and contains a list of the alternate frequencies on the network. As the vehicle travels, the radio automatically monitors the signals at the alternate frequencies and decides if it should switch to a station providing a better quality signal in the list of alternate frequencies. In a receiver having a single tuner, the radio monitors the stations in the list of alternate frequencies by quickly tuning from the current station to another station in the list of alternate frequencies and then back to the original station. During the quick tuning to the alternate frequency, the radio collects statistics, which generally determine the signal quality of the alternate frequency station. While the RDS configured receiver is able to monitor other stations, particularly with a single tuner, it does so in order to provide the same identical program information.

It is therefore desirable to provide for a cost affordable radio and method of monitoring data in an alternate band, such as the weather band, for providing warning alert data in a manner that does not require multiple tuners. In particular, it is desirable to provide for such a radio and method for use in a vehicle to monitor the warning alert data made available on the weather band in a way that does not interfere with the current radio station programming.

SUMMARY OF THE INVENTION

In accordance with the teachings of the present invention, an RF radio and a method of monitoring warning alert data is provided. According to one aspect of the present invention, an RF radio is provided having a radio band configured to receive warning alert data. The radio includes a radio receiver for receiving broadcast radio wave signals, and a tuner adjustable for selecting radio wave signal channels within a first radio band and radio wave signal channels within a second radio band. The second radio band is adapted to provide warning alert data. The radio also includes a controller for controlling the tuner to select a radio wave signal channel within the first radio band. The controller controls the tuner to periodically switch to the second radio band and determine presence of warning alert data. The controller further initiates receipt of the warning alert data when such warning alert data is determined to be present.

According to another aspect of the present invention, a method of monitoring warning alert data broadcast in a radio band of an RF radio is provided. The method includes the steps of receiving broadcast radio wave signals with a radio receiver, and selecting a radio wave signal channel within a first radio band with a tuner. The method also includes the steps of periodically switching the tuner to a second radio band, and detecting presence of warning alert data in the second radio band. The method further includes the step of initiating receipt of the warning alert data when such warning alert data is detected.

Accordingly, the radio and method of the present invention advantageously monitors and determines the presence of warning alert data made available in an alternate frequency band. By employing the radio and method of the present invention, the monitored warning alert data can effectively be presented to a user in a cost-effective and timely manner with little or no interference to reception of the radio wave signals in the first radio band.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
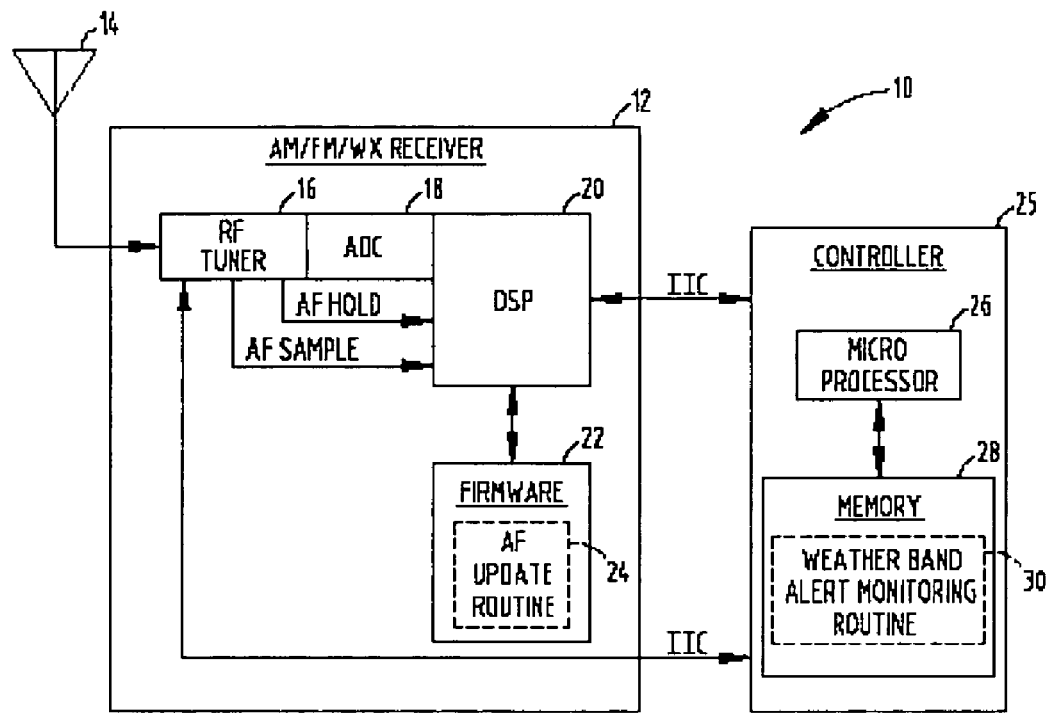
FIG. 1 is a block diagram illustrating a radio adapted to monitor warning alert data according to one embodiment of the present invention.

Referring now to FIG. 1, an RF radio 10 is generally illustrated for receiving and processing RF audio signals in any of the AM, FM and weather (WX) bands. The RF radio 10 includes an antenna 14, an AM/FM/WX receiver 12 and a controller 25, according to the embodiment shown. The antenna 14 may include one or more antennas for receiving AM, FM and weather band frequencies as is generally known in the art. According to one example, the RF radio 10 may be employed on board a vehicle in a mobile environment. It should further be appreciated that the radio 10 provides output signals to one or more audio speakers which broadcast audio sound. Output signals may also be provided to a display or other human machine interface device for presenting data.

The receiver 12 is an AM, FM, weather band receiver generally capable of receiving and processing radio frequency signals in all three radio bands. Within the AM band, the receiver 12 may tune to any of a number of available AM frequencies and process the audio data made available at the tuned frequency. Similarly, the receiver 12 may tune to and process signals at a select frequency within the FM radio band. Further, receiver 12 may tune to and process RF signals broadcast in the weather band, which may include weather information and warning alert data.

Included in the radio receiver 12 is an RF tuner 16 which is coupled to the antenna 14 for receiving signals received on antenna 14. The RF tuner 16 may be included in the receiver 12 as shown or may be separate therefrom. The RF tuner 16 is adjustable to select and tune to a selected frequency within a selected radio band. The tuner 16 provides an output signal to an analog-to-digital converter (ADC) 18 which converts the analog selected frequency signal to a digital signal. A digital signal processor (DSP) 20 is coupled to the ADC 18 for processing the digital signal. The DSP 20 is coupled to memory, such as firmware 22. Stored in firmware 22 and processed by DSP 20 is an alternate frequency (AF) update routine 24 as described herein. The AF update routine 24 periodically monitors an alternate frequency in a different radio band and determines presence of warning alert data at the alternate frequency. The AF update routine 24 may be repeated to look for warning alert data at other alternate frequencies in the alternate radio band.

The RF radio 10 further includes a controller 25 which includes a microprocessor 26 and memory 28. The controller 25 may be separate from the receiver 12 as shown or may be integrated therewith. Stored within memory 28 and executed by microprocessor 26 is a weather band alert monitoring routine 30. The controller 25 is generally coupled to the DSP 20 and the RF tuner 16 by way of a communication bus, shown as the inter-IC (IIC) communication bus. The microprocessor 26 generally controls various radio functions including mode changing among the AM, FM and weather radio bands, as well as tuning, seek and scan functions, amongst other functions. When the microprocessor 26 initiates a tune, a seek, a scan or other function, it sends a command to the tuner 16, which activates a state machine according to one embodiment. The state machine of the tuner 16 informs the DSP 20 of the state of the RF tuner 16 during the tune, seek, scan or other initiated function via the AF sample and AF hold flags. The AF sample and AF hold flags are binary flags, whose state and timing inform the DSP 20 as to the current state of the tuner 16 is in and which state the DSP 20 should have.

The RF tuner 16 is adjustable via a user and is automatically adjustable via the DSP 20 and microprocessor 26 to tune one at a time to a plurality of available AM, FM or weather band channels at select frequencies in multiple radio bands for receiving RF signals. In the AM band mode, the RF tuner 16 tunes to a channel frequency in the AM band which generally includes frequencies ranging from 530 kHz to 1,710 kHz, with 10 kHz spacings in the United States. In the FM band mode, the RF tuner 16 tunes to a frequency within the FM frequency band which generally includes frequencies ranging from 87.9 MHz to 107.9 MHz, with 0.2 MHz channel spacing in the United States. The AM and FM radio bands generally provide audio radio signals.

In the weather band mode, the RF signals may contain weather, emergency and other warning alert data. NOAA weather radio service currently transmits seven weather band channels in the very high frequency range of 162.40 kHz to 162.55 kHz, having a 25 kHz spacing between adjacent channels. In the weather band, the RF tuner 16 can be adjusted to tune to any one of the seven frequencies (channels) that are made available. The NOAA weather radio service currently transmits weather and warning alert data on the weather band, and provides for an emergency alert system in which weather and weather alert data are broadcast, as part of the specific area message encoding (SAME) message. The SAME message includes one or more geographic identifiers, generally in the form of alphanumeric codes, which define the geographical counties to which the weather or warning alert data pertains. Currently, each geographic identified code corresponds to a unique county, however, other geographic boundaries may be defined and assigned a unique code. The SAME area message generally uses audio frequency shift keying (AFSK) to generate digital data. In this system, logic zero typically is 1562.5 Hz and logic one typically is 2083.3 Hz, with a 520.8 bits per second data rate. The transmitted data generally includes the disseminating authority, the type of warning alert, the locations of the affected areas, and the start and duration of the warning alert.

The warning alert data made available on the weather band may include weather related warning events and non-weather related warning events. Examples of warning alert data for weather related events include the following: blizzard warning; coastal flood watch or warning; dust storm warning; flash flood watch, warning or statement; flood watch, warning or statement; high wind watch or warning; hurricane watch, warning or statement; severe thunderstorm watch, warning or statement; special marine warning; special weather statement; tornado watch or warning; tropical storm watch or warning; tsunami watch or warning; and winter storm watch or warning. Examples of warning alert data for non-weather related events include the following: administrative messages; avalanche watch or warnings; a child abduction emergency; civil danger warning; civil emergency message; earthquake warning; evacuation immediate; fire warning; hazardous materials warning; law enforcement warning; local area emergency; 911 telephone outage emergency; nuclear power plant warning; radiological hazard warning; shelter in place warning; and volcano warning. It should further be appreciated that the warning alert data may include other warnings such as Homeland Security warnings, emergency action notification and termination signals; national information center information, and national periodic testing, including monthly and weekly testing signals.

A description of the current specific area message encoding and listing of the available warning alert data provided by the NOAA weather radio service is disclosed in the published report entitled "NOAA WEATHER RADIO ALL HAZARDS (NWR) SPECIFIC AREA MESSAGE ENCODING (SAME)," National Weather Service Instruction 10-1712, dated Feb. 17, 2006, which is hereby incorporated herein by reference.

It should be appreciated that the alternate frequency may include the weather band frequency that is relevant to the geographic location of the radio, according to one embodiment. According to other embodiments, the alternate frequency may check more than one frequency and up to all seven frequencies broadcast on the weather radio band.

Figure 2:
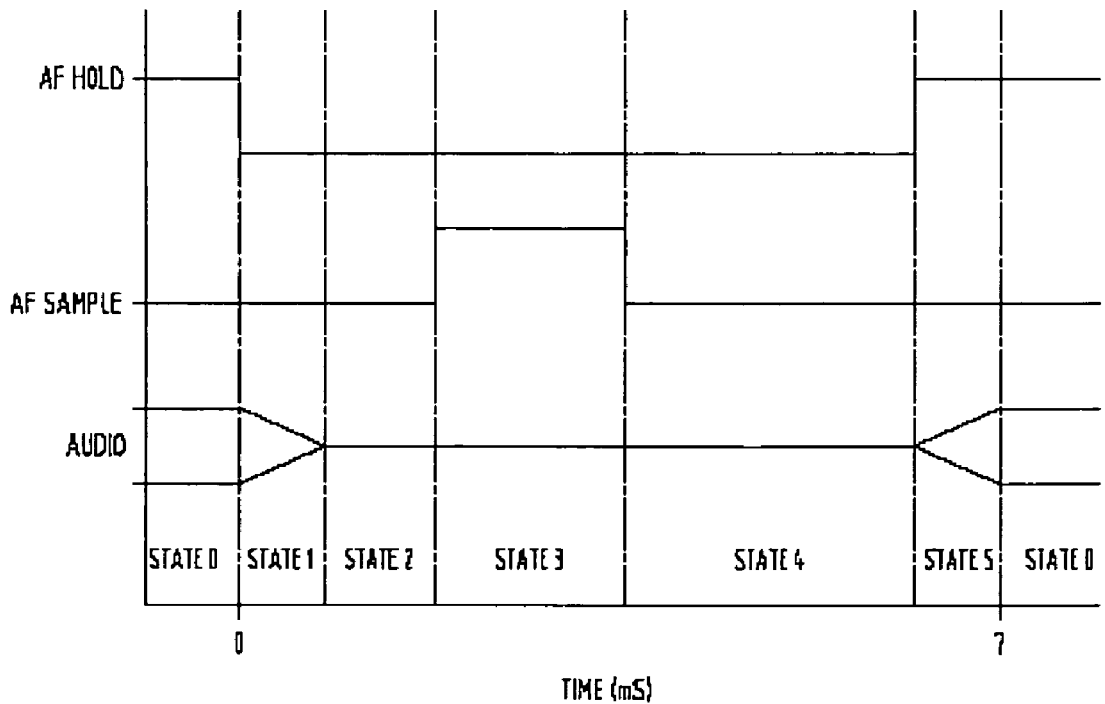
FIG. 2 is a timing diagram illustrating an alternate frequency (AF) update used to monitor warning alert data at alternate frequencies, according to one embodiment.

Referring to FIG. 2, various signal states are illustrated during an alternate frequency (AF) update in the timing diagram, according to one embodiment. As seen, the AF update occurs during states zero through five and returns to state zero following the AF update. After receiving an AF update command from the microprocessor 26, the state machine in the RF tuner 16 goes from state zero, which is the normal state, to state one, which instructs the DSP 20 to mute the audio received in the first radio band (e.g., frequency X in FM band). During state two, the tuner 16 tunes to an alternate frequency (AF) station in a second radio band, such as the weather radio band. During state three, the tuner 16 is tuned to the alternate frequency in the weather band and the DSP 20 collects the signal quality information for approximately two milliseconds. During state four, the tuner 16 tunes back to the original station at frequency X in the first radio band (e.g., FM band) and the DSP 20 stops collecting signal quality information and stores the signal quality information from the alternate frequency in memory. In state five, the radio is unmuted to again allow output of audio before returning to the normal state zero. According to one embodiment, the AF update process illustrated in FIG. 2 may be executed in less than ten milliseconds, and may occur in approximately five to seven milliseconds, which essentially does not interfere with the receipt and processing of radio signals in the first radio band.

The RF radio 10 essentially utilizes the AF update routine 24 to determine when the SAME data in the weather radio band is being transmitted, such that the presence of warning alert data can be determined. When the RF radio 10 is tuned to either the AM or FM radio bands, the radio performs the AF update on the weather band to check one or more of the weather band frequencies periodically and determines the presence of warning alert data. During state three of the AF update, the DSP 20 collects approximately two milliseconds of the audio signal from the weather band. The radio 10 then determines if the weather band station is transmitting warning alert data by performing a correlation of the audio signal to the two AFSK synthesized tones, which are utilized in the SAME signal broadcast.

Figure 3:
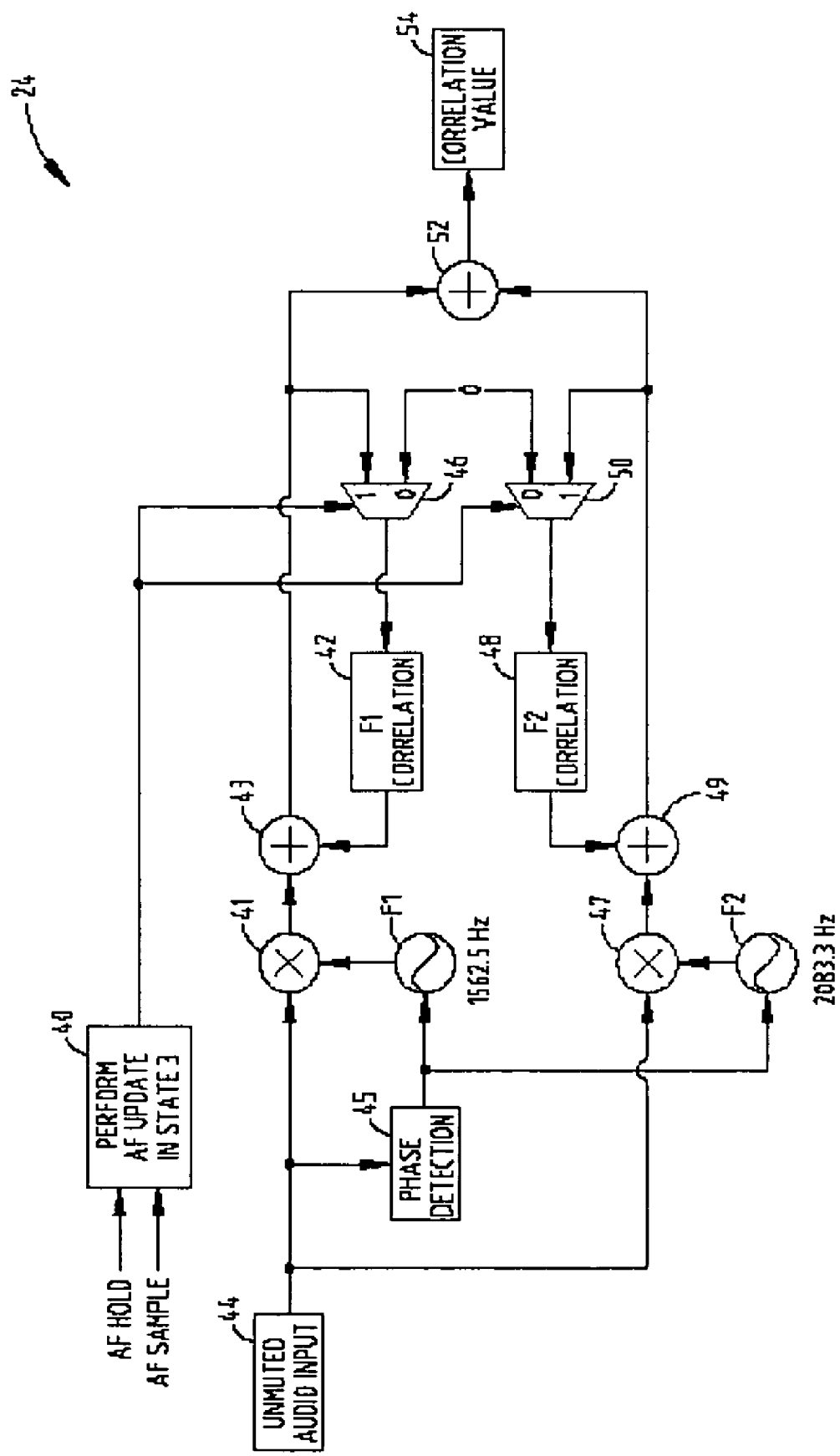
FIG. 3 is a flow diagram illustrating the alternate frequency update routine, according to one embodiment.

Referring to FIG. 3, the AF update routine 24 is generally illustrated receiving from the tuner the AF hold and AF sample flags to determine if the state machine is in state 3 of the AF update as seen in step 40. If the state machine is in state 3, then an enable signal is set high, which starts a correlation algorithm that attempts to determine if either AFSK tone or a combination of both AFSK tones are present in the audio. In this state, the audio input is unmuted as shown by step 44. The correlation algorithm is performed which processes the AFSK synthesized tone at the 1562.5 Hz signal generated by oscillator F1. Similarly, the correlation algorithm is also executed in accordance with the AFSK synthesized tone at the 2083.3 Hz signal generated by oscillator F2.

The correlation algorithm will now be described in more detail. The correlation algorithm attempts to determine if either AFSK synthesized tone or a combination of both AFSK synthesized tones are present in the audio for the two millisecond window in state three of the AF update process. In the one path, referred to as the F1 path, the correlation algorithm includes a multiplier 41 that multiplies the audio signal as an input with the frequency F1 of 1562.5 Hz. In the AFSK coded message, the frequency 1562.5 Hz represents logic zero. The product output from multiplier 41 is integrated for the duration of state three, which is indicated by the enable input. The integration is provided by summer 43, F1 correlation block 42 and integrator 46. Integrator 46 integrates the output in the F1 path via integrator 46 and provides the integrated output as a feedback signal to the F1 correlation block 42 which is then summed with the output of multiplier 41. The output of summer 43 is then provided as an input to summer 52.

The correlation algorithm performs a similar correlation in a second path, referred to as the F2 path, which includes a multiplier 47 for multiplying the audio signal by the second frequency of 2083.3 Hz. In the AFSK coded message, the frequency 2083.3 Hz represents logic one. The product output from multiplier 47 is integrated for the duration of state three, which is indicated by the enable input. The integration performed in the F2 path includes integrator 50, F2 correlation block 48, and summer 49. The signal in the F2 path is integrated by integrator 50, which is provided to F2 correlation block 48, and the output thereof is summed with the output of multiplier 47 via summer 49. The output of summer 49 is then provided as an input to summer 52.

The correlation values generated in the F1 and F2 paths are summed by step 52 to arrive at the summed correlation value 54. The summed correlation value 54 is compared to a correlation threshold in the weather band alert module routine 30 as described herein to determine the presence of warning alert data.

The correlation algorithm is shown including a phase detection block 45 that receives the audio signal and provides phase detection output signals to frequency oscillators F1 and F2. The purpose of phase detection block 45 is to adjust the phase of the F1 oscillator to match the phase of the audio input. If the audio input consists entirely of the F1 tone, but is exactly ninety degrees out of phase from the F1 oscillator, then the correlation value will be zero. To avoid this problem, the phase of the F1 oscillator is adjusted to match the phase of the incoming audio signal, so that the maximum correlation value can be achieved. Similarly, the phase detection block 45 adjusts the phase of the F2 oscillator to match the phase of the incoming audio signal, so that the maximum correlation value can be achieved.

Figure 4:
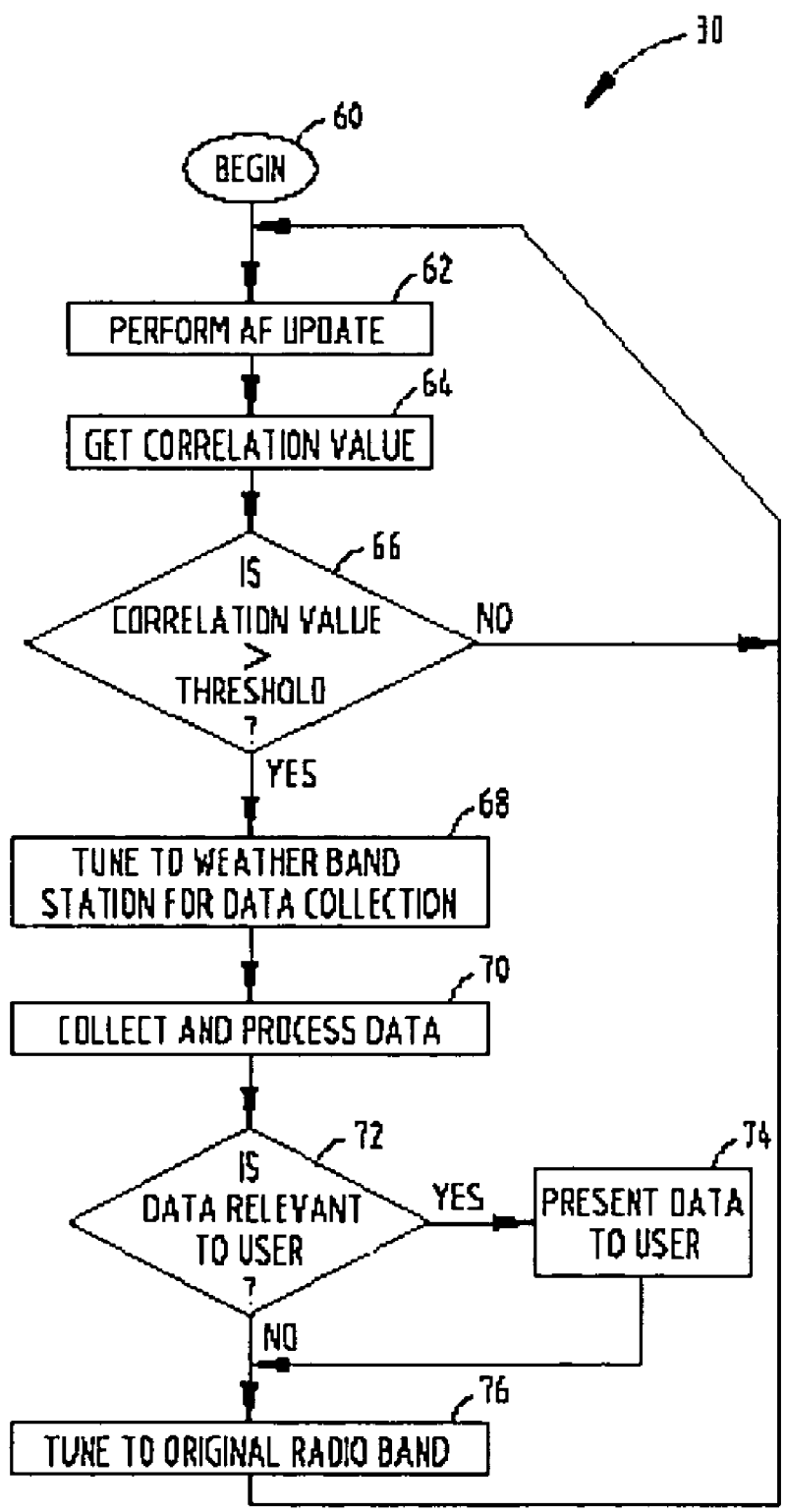
FIG. 4 is a flow diagram illustrating the weather band alert monitoring routine, according to one embodiment.

Referring to FIG. 4, the weather band alert monitoring routine 30 is illustrated according to one embodiment. Routine 30 begins at step 60 and proceeds to perform an AF update in step 62. The AF update includes performing the AF update routine 24 to provide for a correlation value which is generally indicative of the signal quality of the data. Next, in step 64, the correlation value is obtained. In decision step 66, routine 30 determines if the correlation value is greater than a threshold and, if not, returns to step 62. If the correlation value is determined to be greater than the threshold, routine 30 proceeds to tune to the alternate frequency in the weather band station to collect data, which includes the warning alert data. Next, in step 70, the warning alert data is collected and processed. In decision step 72, routine 30 determines if the warning alert data is relevant to the user and, if not, tunes to the original radio band in step 76 before returning to step 62. If the warning alert data is determined to be relevant to the user, routine 30 presents the data to the user or otherwise processes the data in step 74 and then tunes to the original radio band in step 76.

Accordingly, the relevant warning alert data is monitored, collected and made available to a user, without adversely interfering with the receipt and processing of user selected radio band signals. Accordingly, the RF radio 10 and method 30 of the present invention advantageously monitors an alternate frequency and provides warning alert data made available to a user without interfering with the user's desired radio band frequency selection. The system and method periodically and momentarily monitors the alternate frequency of the weather band to determine the presence of warning alert data and, if present, allows for the receipt and presentation of the data.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An RF radio configured to detect broadcast warning alert data, comprising:
    a tuner configured for receiving broadcast radio wave signals on radio wave signal channels, said broadcast radio wave signals including a first radio frequency band and a second radio frequency band outside of the first frequency band and said tuner being adapted to be selectively tuned to at least one of the first radio frequency band and the second radio frequency band, and said first radio frequency band spanning from a first frequency to a second frequency, and the second frequency band including at least one channel adapted to include at least one AFSK synthesized tone; and
    a memory including an alternate frequency (AF) update routine being adapted to periodically monitor for warning alert data being broadcast in the second frequency band while the tuner is selectively tuned to at least one of the first and the second radio frequency band, said monitored warning alert data having a correlation of quality of the broadcast radio wave signal to at least one AFSK synthesized tone in the at least one channel in the second frequency band, and the correlation being detected by the AF update routine;
    wherein the radio is adapted to switch the tuner between a radio wave signal channel on the at least one of the first and the second radio frequency band to the second frequency band during operation of the AF update routine to allow the AF update routine to detect presence of the warning alert data being broadcast in the second radio frequency band.

2. The radio as defined in claim 1, wherein the second radio frequency band is a weather band.

3. The radio as defined in claim 2, wherein the weather band comprises specific area message encoding (SAME) weather band signals.

4. The radio as defined in claim 1, wherein the tuner comprises an FM band, AM band and weather band tuner.

5. The radio as defined in claim 1, further comprising:
    a controller being in electrical connection to the tuner and the AF update routine, said controller being adapted to periodically switch the tuner between a radio wave signal channel selectively tuned on the at least one of the first and the second radio frequency band to the second radio frequency band to allow the AF update routine to detect presence of the warning alert data being broadcast in the second radio frequency band.

6. The radio as defined in claim 5, wherein the controller periodically tunes the tuner to the second radio frequency band for a momentary time period during operation of the AF update routine to check for the presence of the warning alert data.

7. The radio as defined in claim 6, wherein the momentary time period is less than about 2 milliseconds.

8. The radio as defined in claim 5, wherein the radio comprises a digital signal processing (DSP) device, and the tuner and the AF update routine and the controller each being in electrical connection to the DSP device, and the controller further including a microprocessor having communication data bus interface to the DSP and the tuner.

9. The radio as defined in claim 5, wherein the controller is disposed remote from the RF radio.

10. The method as defined in claim 9, further including a step of:
    returning the tuner setting to the selectively tuned at least one of the first and the second radio frequency band following the periodic switching of the tuner to the second radio frequency band.

11. The method as defined in claim 10, wherein the steps of periodically switching the tuner, detecting presence of warning alert data, and returning the tuner setting to the selectively tuned at least one of the first and the second radio frequency band occur in less than about ten milliseconds when no warning alert data is detected.

12. The radio as defined in claim 1, wherein a correlation value is an output of a correlation algorithm in the AF update routine, said correlation value being in relationship to input electrical signals from the tuner to the correlation algorithm, said input electrical signals comprising an AF hold and an AF sample signal.

13. The radio as defined in claim 12, wherein said controller switches to the second frequency band to collect the warning alert data after the correlation value exceeds a predetermined threshold value.

14. The radio as defined in claim 1, wherein the radio comprises a vehicle radio.

15. The radio as defined in claim 1, wherein the correlation as detected by the AF update routine comprises at least one of:
    (i) a first AFSK synthesized tone disposed at a first AFSK frequency in the at least one channel in the second frequency band;
    (ii) a second AFSK synthesized tone disposed at a second AFSK frequency different from the first AFSK frequency in the at least one channel in the second frequency band;
    (iii) the first and the second AFSK synthesized tone disposed at the respective first and second AFSK frequency in the at least one channel in the second frequency band; and
    (iv) any combination of (i)-(iii), thereof.

16. The radio as defined in claim 1, wherein the AF update routine comprises an AF update routine circuit, said AF update routine circuit comprising:
    an output signal of the AF circuit, said output signal being a correlation value;
    a first correlation signal;
    a second correlation signal different from the first correlation signal;
    a first integrated feedback signal of the first correlation signal;
    a second integrated feedback signal of the second correlation signal;

a first multiplied signal including an audio signal multiplied by a first AFSK signal frequency;

a second multiplied signal including the audio signal multiplied by a second AFSK signal frequency;

the AF hold signal produced by the tuner; and the AF sample signal produced by the tuner;

wherein the first correlation signal is a summation of the first integrated feedback signal and the first multiplied signal and the second correlation value is a summation of a second integrated feedback signal and a second multiplied signal, and the AF hold signal and the AF sample signal are inputs being in respectful relation to the first and the second integrated feedback signal.

17. The radio as defined in claim 16, wherein the first AFSK signal frequency is produced by a first oscillator resonating at 1562.5 Hertz and the second AFSK signal frequency is produced by a second oscillator resonating at 2083.3 Hertz, and the first AFSK signal frequency is an AFSK coded message corresponding to logic zero and the second AFSK signal frequency is an AFSK coded message corresponding to logic one.

18. The radio as defined in claim 16, wherein the AF update routine operates in successive states comprising a first, second, third, forth, and fifth state, and the first and the second multiplied signal are integrated during the third state, and the AF hold and the AF sample signal are collectively used by the AF update routine to determine if the AF update routine is in the third state.

19. The radio as defined in claim 1, wherein the AF update routine operates in less than about 10 milliseconds when monitoring a single channel on the second radio frequency band.

20. A method of monitoring warning alert data broadcast in a radio band received by an RF radio, said method comprising the steps of:

receiving broadcast radio wave signals with the RF radio, wherein said broadcast radio wave signals are disposed in radio wave signal channels in a first radio frequency band and a second radio frequency band outside of the first radio frequency band, and said first radio frequency band spans from a first frequency to a second frequency, and the second frequency band including at least one radio wave signal channel is adapted to include at least one AFSK synthesized tone;

selectively tuning a radio wave signal channel in at least one of the first and the second radio frequency band with a tuner;

periodically monitoring for warning alert data broadcast in the second radio band by an alternate frequency (AF) update routine;

periodically switching, by a radio, the tuner during operation of the AF update routine, from the selectively tuned at least one of the first and second radio frequency band to the second radio frequency band allowing the AF update routine to check for warning alert data;

detecting presence of the warning alert data in the second radio band by the AF update routine, said monitored warning alert data having a correlation of quality of the broadcast radio wave signal to at least one AFSK synthesized tone in the at least one channel in the second frequency band, and the correlation being detected by the AF update routine.

21. The method as defined in claim 20, wherein the step of receiving broadcast radio wave signals includes the second radio frequency band comprising a weather band.

22. The method as defined in claim 21, wherein the step of receiving broadcast radio wave signals includes the weather band comprising specific area message encoding (SAME) weather band signals.

23. The method as defined in claim 20, wherein the step of detecting the presence of the warning alert data further includes a step of:

outputting a correlation value established by correlation algorithm of the AF update routine, and said correlation value being in relation to an AF hold signal and an AF sample signal supplied by the tuner to the correlation algorithm, and the correlation value being in further relation to additional electrical signals produced from a first AFSK signal frequency and from a second AFSK signal frequency generated in the correlation algorithm of the AF update routine.

24. The method as defined in claim 20, wherein the method is performed on a RF radio disposed in a vehicle.

25. The method as defined in claim 20, further including a step of:

periodically switching, by a controller in the radio, the tuner during operation of the AF update routine, from the selectively tuned at least one of the first and second radio frequency band to the second radio frequency band allowing the AF update routine to monitor for the warning alert data.

26. The method as defined in claim 25, further including a step of:

switching the tuner, by the controller, to the second radio frequency band to collect the warning alert data after the correlation comprising a correlation value produced by the AF update routine exceeds a threshold value.

27. The method as defined in claim 26, further including a step of:

returning the tuner, by the controller, to at least one of the selectively tuned first and the second radio frequency band after the warning alert data has been collected by the AF update routine, and the warning alert data is collected after the correlation value has exceeded a threshold value.

28. The method as defined in claim 25, wherein the step of periodically switching, by the controller in the radio, the tuner during operation of the AF update routine, occurs for about 2 milliseconds.

29. An autonomous vehicular alert warning system, comprising:

a vehicle;

a vehicular entertainment system disposed in the vehicle including an RF radio configured to detect broadcast warning alert data, said RF radio comprising:

a tuner configured for receiving broadcast radio wave signals on radio wave signal channels, said broadcast radio wave signals including a first radio frequency band and a second radio frequency band outside of the first frequency band and a third frequency band outside the first and the second frequency band, and said tuner being adapted to be selectively tuned to at least one of the first and the second and the third radio frequency band, and said first radio frequency band spanning from a first frequency to a second frequency and said third radio frequency band spanning from a first frequency to second frequency, and the second frequency band including at least one channel adapted to include at least one AFSK synthesized tone; and an alternate frequency (AF) update routine being adapted to periodically monitor for warning alert data being broadcast in the second frequency band while the tuner is selectively tuned to the at least one of the first and the second and the third radio frequency band, said monitored warning alert data having a correlation of quality of the broadcast radio wave signal to at least one AFSK synthesized tone in the at least one channel in the second frequency band, and the correlation being detected by the AF update routine;

wherein the radio is adapted to switch the tuner between a radio wave signal channel on the selectively tuned at least one of the first and the second radio frequency band to the second frequency band during operation of the AF update routine to allow the AF update routine to detect presence of the warning alert data being broadcast in the second radio frequency band.

30. The vehicular alert warning system as defined in claim 29, wherein the system further includes:

a controller being in electrical connection to the tuner and the AF update routine, said controller being adapted to switch the tuner between a radio wave signal channel selectively tuned on the at least one of the first and the second and the third radio frequency band to the second radio frequency band to allow the AF update routine to detect presence of the warning alert data being broadcast in the second radio frequency band.

* * * * *